US 12,442,425 B2

(12) United States Patent
Yamada et al.

(10) Patent No.: US 12,442,425 B2
(45) Date of Patent: Oct. 14, 2025

(54) SPRING MEMBER

(71) Applicant: NHK SPRING Co., Ltd., Yokohama (JP)

(72) Inventors: Yoshio Yamada, Yokohama (JP); Hironobu Imaizumi, Yokohama (JP); Norihiro Tajima, Yokohama (JP); Shuji Takahashi, Yokohama (JP)

(73) Assignee: NHK SPRING CO., LTD., Yokohama (JP)

( * ) Notice: Subject to any disclaimer, the term of this patent is extended or adjusted under 35 U.S.C. 154(b) by 210 days.

(21) Appl. No.: 18/033,923

(22) PCT Filed: Oct. 15, 2021

(86) PCT No.: PCT/JP2021/038324
§ 371 (c)(1),
(2) Date: Apr. 26, 2023

(87) PCT Pub. No.: WO2022/091824
PCT Pub. Date: May 5, 2022

(65) Prior Publication Data
US 2023/0400078 A1 Dec. 14, 2023

(30) Foreign Application Priority Data
Oct. 28, 2020 (JP) ................................. 2020-180435

(51) Int. Cl.
*F16F 1/18* (2006.01)
*H01L 23/00* (2006.01)
*H01L 23/34* (2006.01)

(52) U.S. Cl.
CPC .............. *F16F 1/185* (2013.01); *H01L 23/34* (2013.01); *H01L 24/72* (2013.01); *F16F 2228/007* (2013.01); *F16F 2238/022* (2013.01)

(58) Field of Classification Search
CPC ...... F16F 1/185; F16F 3/023; F16F 2228/007; F16F 2238/022

(Continued)

(56) References Cited

U.S. PATENT DOCUMENTS 4,753,616 A * 6/1988 Molitor ................ H01R 13/187
439/825
5,244,189 A * 9/1993 Pierman .................... F16F 1/20
267/51

(Continued)

FOREIGN PATENT DOCUMENTS

| JP | H1050368 A | * | 2/1998 |
| JP | 2007166820 A | | 6/2007 |
| JP | 2014011936 A | | 1/2014 |
| JP | 2016029693 A | | 3/2016 |
| WO | 2015064572 A1 | | 5/2015 |
| WO | WO-2016207118 A1 | * | 12/2016 ........... H01L 23/492 |
| WO | 2017033802 A1 | | 3/2017 |
| WO | WO-2023176721 A1 | * | 9/2023 |

OTHER PUBLICATIONS

International Search Report corresponding to International Application No. PCT/JP2021/038324; Mailing Date, Nov. 16, 2021.

*Primary Examiner* — Thomas J Williams
(74) *Attorney, Agent, or Firm* — CANTOR COLBURN LLP

(57) ABSTRACT

The spring member (1, 2, 3) includes a conductive plate (11) and a support plate (12), the conductive plate is formed of a material in which at least one of electrical conductivity and thermal conductivity thereof is higher than that of a material forming the support plate, the support plate is formed of the material having a higher Young's modulus than that of the material forming the conductive plate, two end portions of the conductive plate in a second direction (X) are provided with first contact portions (13) that contact a first pressed body (W1), an intermediate portion of the conductive plate in the second direction is provided with a second contact portion (14) that contacts a second pressed body (W2), the two end portions of the conductive plate in the second direction are engaged with two end portions of the support plate in the second direction, an intermediate portion of the support plate in the second direction is provided with a third contact portion (15) that contacts the second contact portion, and the second contact portion is sandwiched between the (Continued)

third contact portion and the second pressed body in a first direction (Z).

12 Claims, 13 Drawing Sheets

(58) Field of Classification Search
USPC ........ 267/36.1, 44, 45, 47, 48, 52, 158, 160, 267/164, 165
See application file for complete search history.

(56) References Cited

U.S. PATENT DOCUMENTS

| | | | | |
|---|---|---|---|---|
| 6,803,523 | B2* | 10/2004 | Yuasa | H01R 13/17 174/88 B |
| 7,387,548 | B2* | 6/2008 | Takehara | H01R 13/187 439/856 |
| 10,297,530 | B2* | 5/2019 | Mizushiri | H01L 23/473 |
| 2004/0040733 | A1* | 3/2004 | Yuasa | H01R 13/17 174/68.2 |
| 2016/0286687 | A1 | 9/2016 | Tajima et al. | |
| 2023/0400078 | A1* | 12/2023 | Yamada | F16F 1/185 |

\* cited by examiner

SPRING MEMBER

CROSS REFERENCE TO RELATED APPLICATIONS

This is the U.S. national stage of application No. PCT/JP2021/038324, filed on Oct. 15, 2021. Priority under 35 U.S.C. § 119(a) and 35 U.S.C. § 365(b) is claimed from Japanese Application No. 2020-180435, filed Oct. 28, 2020, the disclosure of which is also incorporated herein by reference.

TECHNICAL FIELD

The present invention relates to a spring member.

BACKGROUND ART

In the related art, as shown in, for example, Patent Document 1 below, a spring member is known which is provided between a first pressed body and a second pressed body facing each other in a first direction in a state where the spring member presses the first pressed body and the second pressed body such that the first pressed body and the second pressed body are away from each other in the first direction.

DOCUMENT OF RELATED ART

Patent Document

[Patent Document 1] Japanese Unexamined Patent Application, First Publication No. 2014-11936

SUMMARY OF THE INVENTION

Problems to be Solved by the Invention

However, in the above spring member in the related art, when intending to use it to flow electric current or transfer heat from either one to the other of the first pressed body and the second pressed body, if prioritizing the load characteristics of the spring member, it may be difficult to stably exhibit characteristics such as electrical conductivity and heat transferability of the spring member as designed.

The present invention is made in view of the above circumstances, and an object thereof is to provide a spring member that can stably exhibit characteristics such as electrical conductivity and heat transferability as designed.

Means for Solving the Problems

In order to solve the above problems and obtain the above object, a spring member of an aspect of the present invention is for being provided between a first pressed body and a second pressed body facing each other in a first direction in a state where the spring member presses the first pressed body and the second pressed body such that the first pressed body and the second pressed body are away from each other in the first direction, the spring member including: a conductive plate and a support plate, wherein the conductive plate is formed of a material in which at least one of electrical conductivity and thermal conductivity thereof is higher than that of a material forming the support plate, the support plate is formed of the material having a higher Young's modulus than that of the material forming the conductive plate, each of the conductive plate and the support plate is curved or bent such that an intermediate portion thereof in a second direction orthogonal to the first direction protrudes toward the second pressed body, two end portions of the conductive plate in the second direction are provided with first contact portions that contact the first pressed body, and the intermediate portion of the conductive plate in the second direction is provided with a second contact portion that contacts the second pressed body, and the two end portions of the conductive plate in the second direction are engaged with two end portions of the support plate in the second direction, and the intermediate portion of the support plate in the second direction is provided with a third contact portion that contacts the second contact portion, and the second contact portion is sandwiched between the third contact portion and the second pressed body in the first direction.

According to the present invention, since the spring member includes the conductive plate and the support plate, when the spring member is provided between the first pressed body and the second pressed body, and the support plate together with the conductive plate is elastically deformed, it is possible to bring the first contact portion and the second contact portion of the conductive plate into strong contact with the first pressed body and the second pressed body, respectively, and to stably exhibit characteristics such as electrical conductivity and heat transferability that the conductive plate mainly has as designed.

Since the support plate is provided with the third contact portion that contacts the second contact portion of the conductive plate, and the second contact portion is sandwiched between the third contact portion and the second pressed body in the first direction, it is possible to reliably bring the second contact portion into strong contact with the second pressed body, and to reliably stabilize the contact state of the conductive plate with respect to the first pressed body and the second pressed body.

Since the spring member includes the conductive plate and the surface of the support plate is not plated with the same material as the conductive plate, it is possible to easily secure at least one of the electrical conductivity and the thermal conductivity to be high, and without peeling of the plating, to exhibit the above-described characteristics as designed for a long period of time.

In the above aspect, the two end portions of the conductive plate in the second direction may be movably engaged with the two end portions of the support plate in the second direction.

In this case, since the two end portions of the conductive plate in the second direction are movably engaged with the two end portions of the support plate in the second direction, it is possible to move the two end portions of the support plate in the second direction relative to the two end portions of the conductive plate in the second direction according to the elastic deformation of the spring member, and to improve the durability thereof compared with, for example, a case where the two end portions of the support plate in the second direction are fixed to the two end portions of the conductive plate in the second direction.

In the above aspect, the two end portions of either one of the conductive plate or the support plate in the second direction may be provided with through-holes, and the two end portions of the other of the conductive plate or the support plate in the second direction may be movably inserted through the through-holes.

In this case, since the two end portions of the other of the conductive plate or the support plate in the second direction are movably inserted through the through-holes provided in the two end portions of the either one of the conductive plate or the support plate in the second direction, it is possible to easily and movably engage the two end portions of the conductive plate in the second direction with the two end portions of the support plate in the second direction.

In the above aspect, sizes of the through-holes in a third direction orthogonal to the first direction and the second direction may decrease toward the intermediate portion in the second direction.

In this case, since the sizes of the through-holes in the third direction decrease toward the intermediate portion in the second direction, in either one of the conductive plate or the support plate, the area of the second contact portion or the third contact portion that receives a pressing force from the second pressed body in the first direction can be secured to be wide, and the durability thereof can be improved.

In the above aspect, the conductive plate may be elastically deformed, and the first contact portions and the second contact portion may be in pressure contact with the support plate in the first direction.

In this case, since the conductive plate is elastically deformed, and the first contact portion and the second contact portion are in pressure contact with the support plate in the first direction, for example, even if the conductive plate and the support plate are provided in a non-bonded state to each other on the entire area thereof, it is possible to prevent the conductive plate and the support plate of one spring member from being easily separated from each other, to easily provide the spring member between the first pressed body and the second pressed body, and to improve each rigidity of the first contact portion and the second contact portion that receive a pressing force in the first direction.

Effects of the Invention

According to the present invention, it is possible to stably exhibit characteristics such as electrical conductivity and heat transferability of a spring member as designed.

EMBODIMENTS FOR CARRYING OUT THE INVENTION

Hereinafter, an embodiment of a spring member according to the present invention is described with reference to the drawings.

Figure 1:
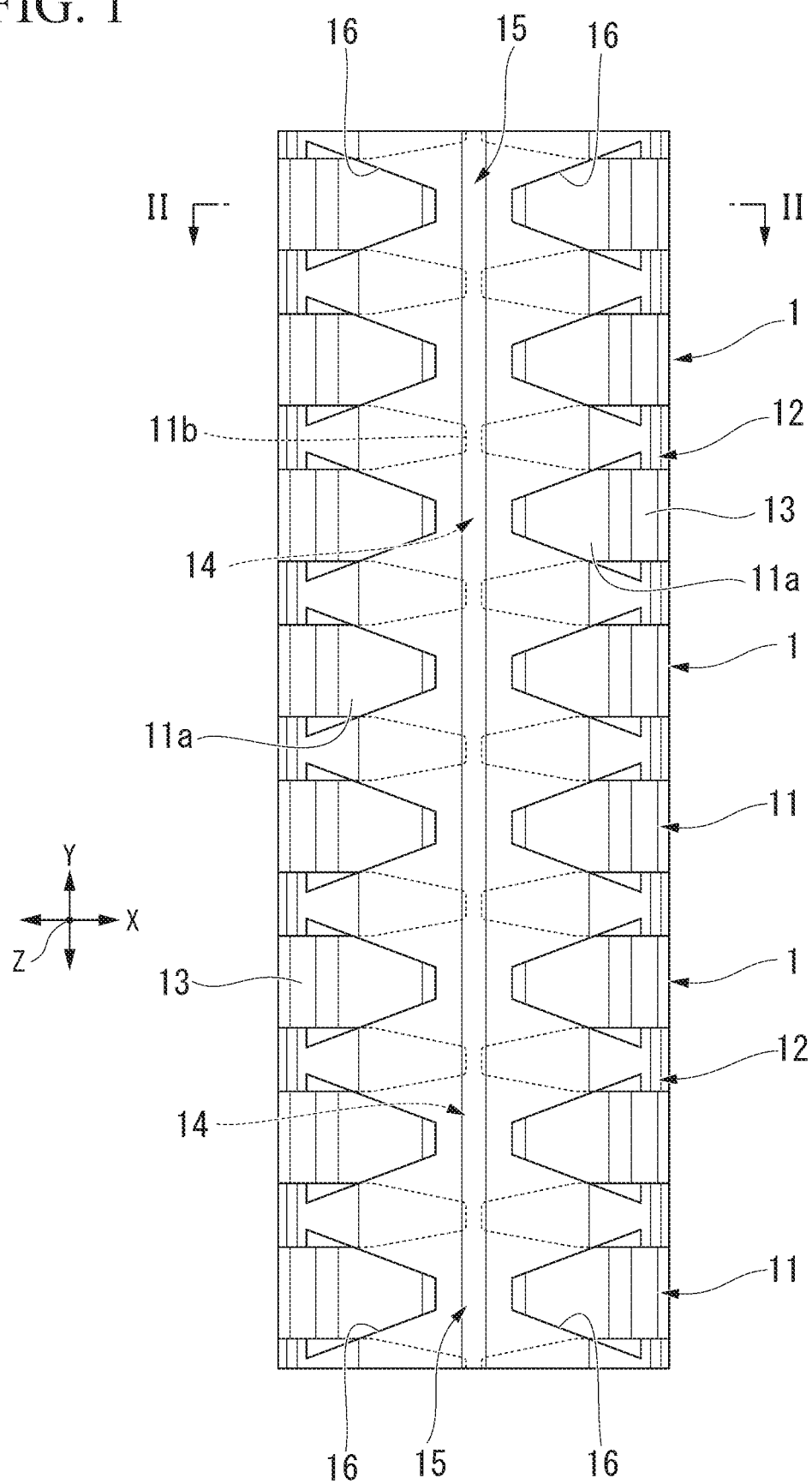
FIG. 1 is a plan view of a spring member shown as an embodiment and viewed from one side in one direction.
Figure 2:
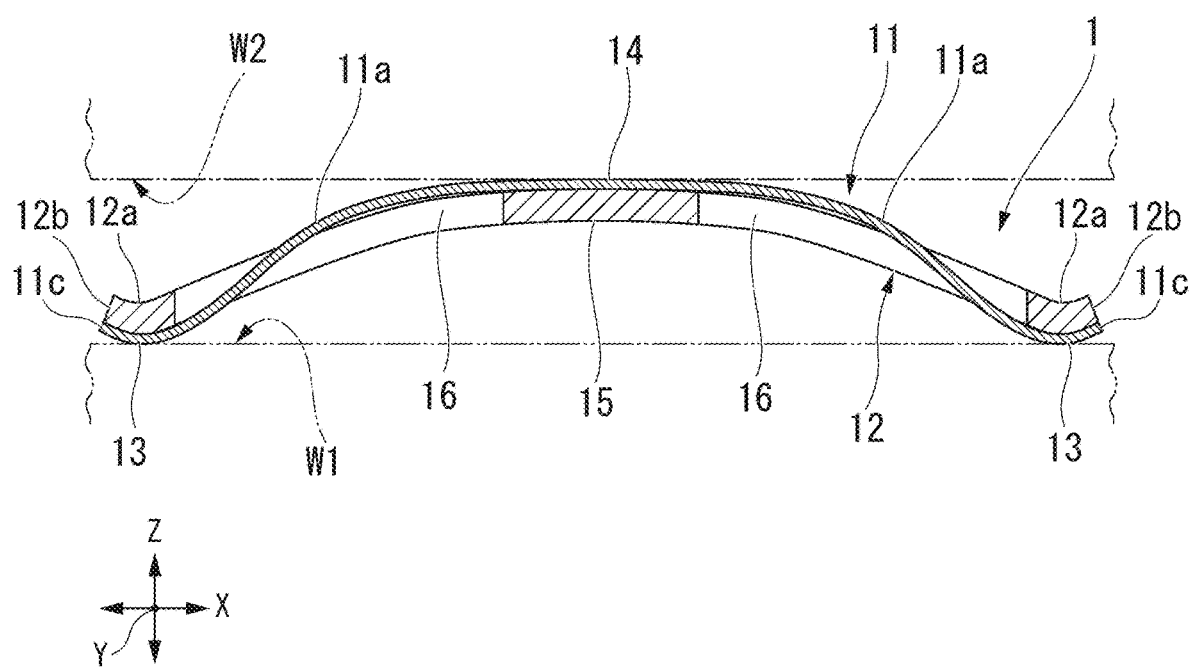
FIG. 2 is a cross-sectional view taken along line II-II and viewed in arrow direction in FIG. 1.

A spring member 1 of this embodiment, as shown in FIGS. 1 and 2, is provided between a first pressed body W1 and a second pressed body W2 facing each other in a first direction Z in a state where the spring member 1 presses the first pressed body W1 and the second pressed body W2 such that the first pressed body W1 and the second pressed body W2 are away from each other in the first direction Z.

The spring member 1 includes a conductive plate 11 and a support plate 12. The conductive plate 11 and the support plate 12 are provided in a non-bonded state to each other on the entire area thereof.

Each of the conductive plate 11 and the support plate 12 is curved or bent such that an intermediate portion thereof in a second direction X orthogonal to the first direction Z protrudes toward the second pressed body W2.

Hereinafter, the first pressed body W1 side in the first direction Z is referred to as one side, and the second pressed body W2 side in the first direction Z is referred to as another side.

In the second direction X, a side away from a central portion toward an end portion is referred to as an outer side, and a side away from the end portion toward the central portion is referred to as an inner side.

A direction orthogonal to the first direction Z and the second direction X is referred to as a third direction Y.

In the example shown in the drawings, each of the conductive plate 11 and the support plate 12 extends from the central portion toward the outer side in the second direction X and toward the one side. Each of the conductive plate 11 and the support plate 12 is curved to be a convex curved surface toward the other side. In other words, each of the conductive plate 11 and the support plate 12 is curved around an axis extending in the third direction Y to be a convex curved surface toward the other side.

Each of the conductive plate 11 and the support plate 12 may be, for example, bent to be sharp-pointed toward the other side.

The conductive plate 11 is formed of a material in which at least one of electrical conductivity and thermal conductivity is higher than that of a material forming the support plate 12. The conductive plate 11 is formed of, for example, copper, aluminum, or the like. The plate thickness of the conductive plate 11 is, for example, about 50 μm to 100 μm.

The support plate 12 is formed of the material having a higher Young's modulus than that of the material forming the conductive plate 11. The support plate 12 is formed of, for example, carbon steel, stainless steel, or the like.

Two end portions of the conductive plate 11 in the second direction X are provided with first contact portions 13 that contact the first pressed body W1, and the intermediate portion of the conductive plate 11 in the second direction X is provided with a second contact portion 14 that contacts the second pressed body W2.

The size of the second contact portion 14 in the third direction Y is greater than the size of the first contact portion 13 in the third direction Y. The area of the second contact portion 14 is greater than the area of the first contact portion 13. The area of the second contact portion 14 may be equal to or less than the area of the first contact portion 13.

Figure 3:
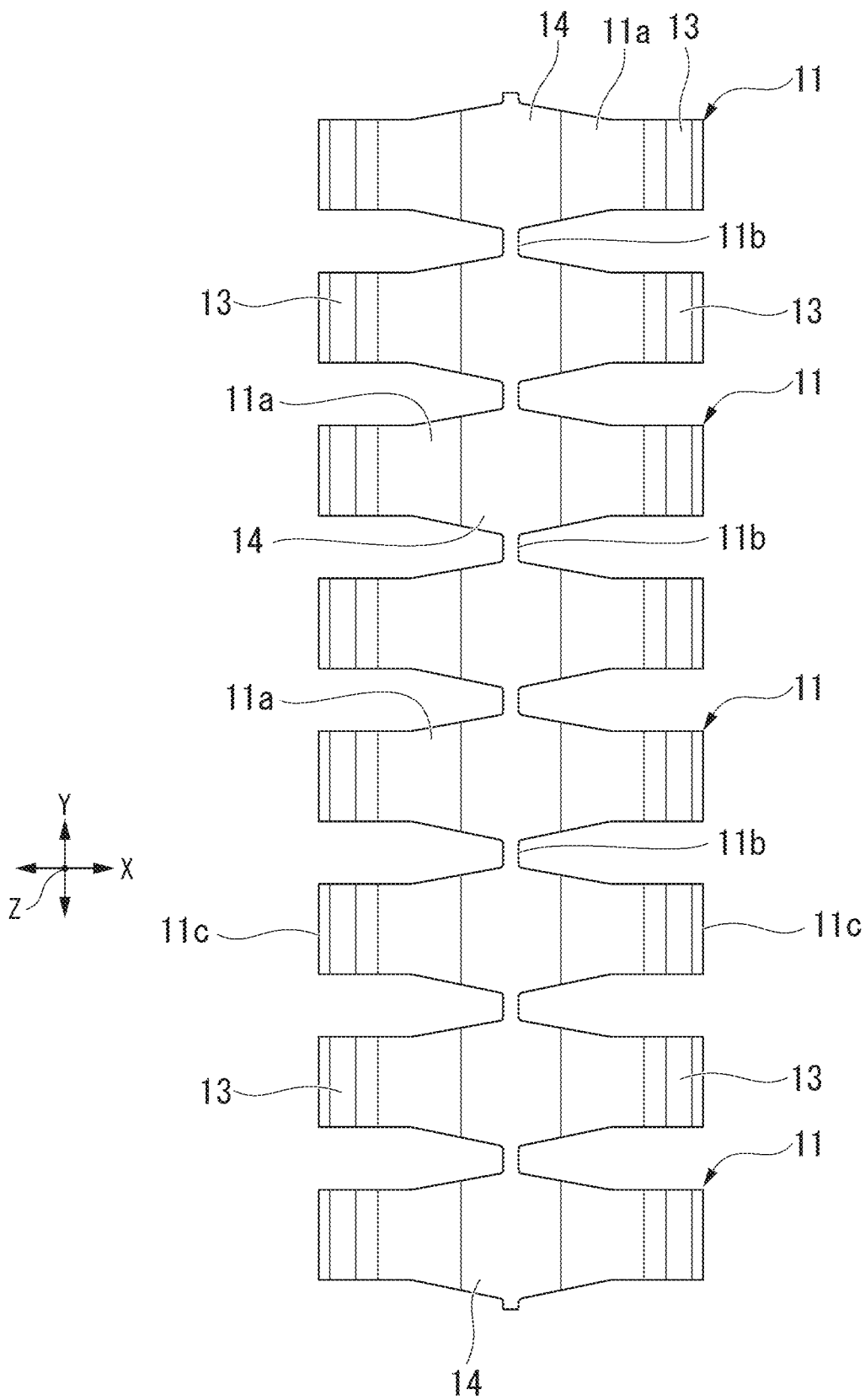
FIG. 3 is a plan view of a conductive plate in FIG. 1 viewed from one side in a first direction.

The first contact portion 13 extends in the second direction X such that an open edge 11c of the conductive plate 11 in the second direction X faces outward in the second direction X. The first contact portion 13 is curved to be a convex curved surface toward the one side. In other words, the first contact portion 13 is curved around an axis extending in the third direction Y to be a convex curved surface toward the one side. As shown in FIGS. 1 and 3, the size of the first contact portion 13 in the third direction Y is equivalent on the entire area in the second direction X.

The second contact portion 14 is formed in a flat plate shape with front and rear surfaces facing in the first direction Z.

In the conductive plate 11, the size in the third direction Y of a connection portion 11a positioned between the first contact portion 13 and the second contact portion 14 and the size of the second contact portion 14 in the third direction Y decrease toward the outer side in the second direction X.

When viewed in the first direction Z, the conductive plate 11 has a symmetrical shape with respect to a straight line (straight line extending in the third direction Y) passing through the center of the conductive plate 11 in the second direction X. When viewed in the first direction Z, the conductive plate 11 has a symmetrical shape with respect to a straight line (straight line extending in the second direction X) passing through the center of the conductive plate 11 in the third direction Y.

As shown in FIG. 2, the two end portions of the conductive plate 11 in the second direction X are engaged with two end portions of the support plate 12 in the second direction X, and the intermediate portion of the support plate 12 in the second direction X is provided with a third contact portion 15 that contacts the second contact portion 14, and the second contact portion 14 is sandwiched between the third contact portion 15 and the second pressed body W2 in the first direction Z.

The third contact portion 15 is positioned in the central portion of the support plate 12 in the second direction X and is formed in a flat plate shape with front and rear surfaces facing in the first direction Z. The surface of the third contact portion 15 facing the other side is covered by the second contact portion 14 of the conductive plate 11. The third contact portion 15 and the second contact portion 14 are in contact with each other in a non-bonded state.

The third contact portion 15 and the second contact portion 14 may be bonded to each other, and in a state before the spring member 1 is provided between the first pressed body W1 and the second pressed body W2, the third contact portion 15 and the second contact portion 14 may be spaced apart from each other in the first direction Z.

The two end portions of the conductive plate 11 in the second direction X are movably engaged with the two end portions of the support plate 12 in the second direction X. In the example shown in the drawings, at least the two end portions of either one of the conductive plate 11 or the support plate 12 in the second direction X are provided with through-holes 16, and the two end portions of the other of the conductive plate 11 or the support plate 12 in the second direction X are inserted through the through-holes 16.

In other words, the through-holes 16 are provided on two sides in the second direction X of the center in the second direction X of either one of the conductive plate 11 or the support plate 12.

Figure 4:
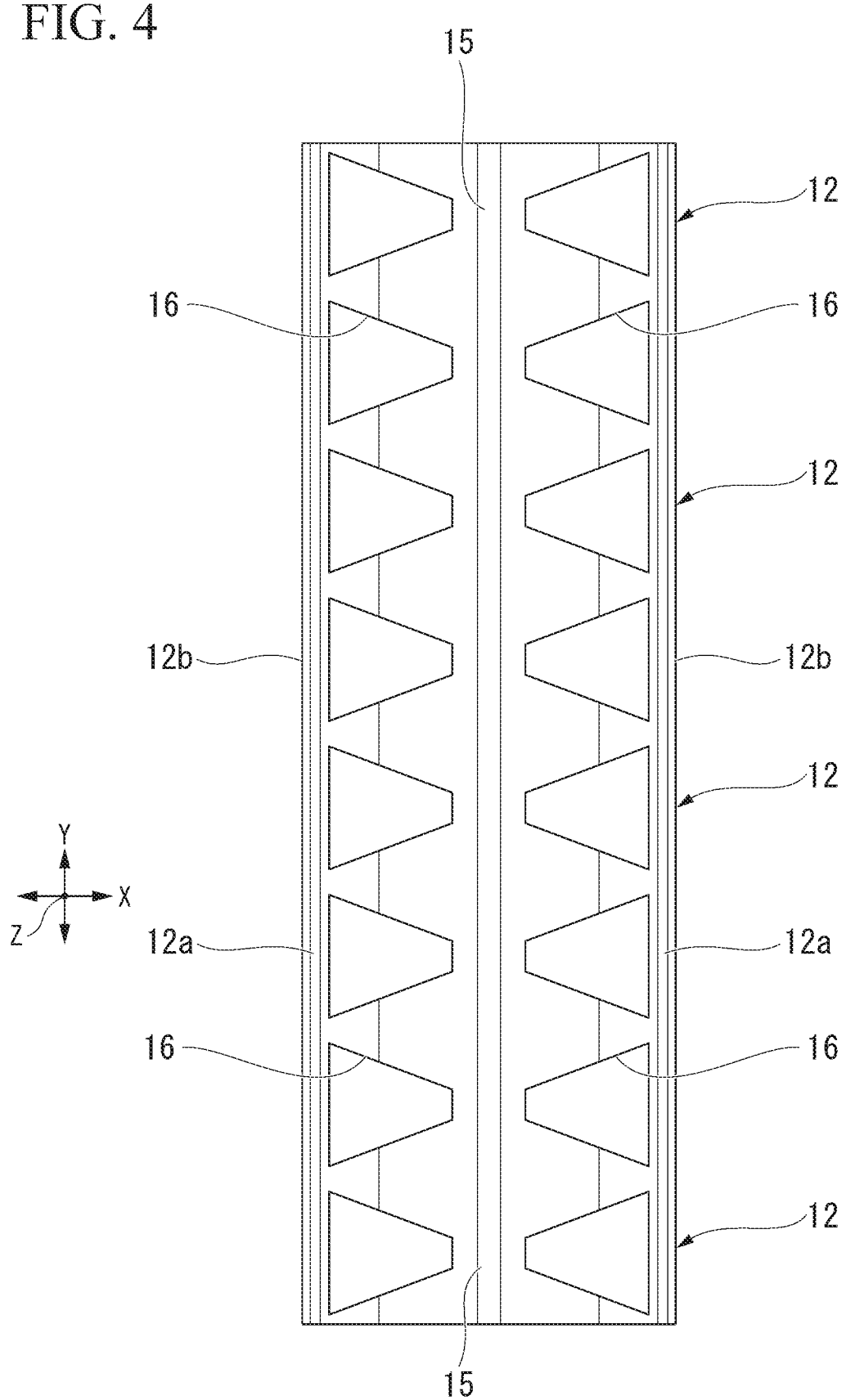
FIG. 4 is a plan view of a support plate in FIG. 1 viewed from one side in the first direction.

In the example shown in the drawings, the through-holes 16 are provided in the support plate 12. The first contact portion 13 and the connection portion 11a of the conductive plate 11 are inserted into the through-hole 16 from the inner side toward the outer side in the second direction X and from the other side toward the one side. As shown in FIGS. 1 and 4, the sizes of the through-holes 16 in the third direction Y decrease toward the inner side in the second direction X. The through-hole 16 has a trapezoidal shape when viewed in the first direction Z.

The through-hole 16, as shown in FIGS. 2 and 4, is integrally formed on the entire area positioned between an outer edge portion 12a connected to an open edge 12b in the second direction X and the central portion in the second direction X in the support plate 12. The through-holes 16 may be slits or the like provided only in two ends of the support plate 12 in the second direction X and extending in, for example, the third direction Y.

In the support plate 12, the outer edge portion 12a, which is positioned on the outer side than the through-hole 16 in the second direction X and is connected to the open edge 12b in the second direction X, extends in the second direction X such that the open edge 12b of the support plate 12 in the second direction X faces outward in the second direction X. The outer edge portion 12a of the support plate 12 is curved to be a convex curved surface toward the one side. In other words, the outer edge portion 12a is curved around an axis extending in the third direction Y to be a convex curved surface toward the one side. The surface of the outer edge portion 12a of the support plate 12 facing the one side is covered by the first contact portion 13 of the conductive plate 11. The outer edge portion 12a of the support plate 12 and the first contact portion 13 are in contact with each other in a non-bonded state. The outer edge portion 12a of the support plate 12 and the first contact portion 13 may be bonded to each other.

When viewed in the first direction Z, the support plate 12 has a symmetrical shape with respect to a straight line (straight line extending in the third direction Y) passing through the center of the support plate 12 in the second direction X. When viewed in the first direction Z, the support plate 12 has a symmetrical shape with respect to a straight line (straight line extending in the second direction X) passing through the center of the support plate 12 in the third direction Y.

In the example shown in the drawings, the conductive plate 11 is elastically deformed, and the first contact portion 13 and the second contact portion 14 are in pressure contact with the support plate 12 in the first direction Z. In a state before the conductive plate 11 and the support plate 12 are assembled together, the size of the support plate 12 in the first direction Z is greater than the size of the conductive plate 11 in the first direction Z.

Portions of the conductive plate 11 and the support plate 12 facing each other in the first direction Z other than through-holes 16 may be in contact with each other on the entire area thereof.

As shown in FIGS. 3 and 4, a plurality of conductive plates 11 are provided to be connected together in the third direction Y, and a plurality of support plates 12 are provided to be connected together in the third direction Y. The numbers of the conductive plates 11 and the support plates 12 are not limited to the example shown in the drawings and may be changed as appropriate.

As shown in FIG. 3, the conductive plates 11 next to each other in the third direction Y are connected through a connection piece 11b only at the central portion thereof in the second direction X. The size of the connection piece 11b in the second direction X is less than the size of the second contact portion 14 in the second direction X. The size of the second contact portion 14 in the third direction Y decreases away from the connection piece 11b in the second direction X.

A spring member may be adopted in which a plurality of support plates 12 separated from each other are attached to a structure in which the plurality of conductive plates 11 are integrally formed in this way. A plurality of connection pieces 11b may be provided at intervals in the second direction X, and the connection piece 11b may be provided at a position away from the center of the conductive plate 11 in the second direction X.

As shown in FIG. 4, the support plates 12 next to each other in the third direction Y are connected to each other on the entire length in the second direction X.

The support plates 12 next to each other in the third direction Y may be connected only through a part or a plurality of places thereof in the second direction X.

A spring member may be adopted in which a plurality of conductive plates 11 separated from each other are attached to a structure in which the plurality of support plates 12 are integrally formed in this way.

As described above, according to the spring member 1 of this embodiment, since the spring member 1 includes the conductive plate 11 and the support plate 12, when the spring member 1 is provided between the first pressed body W1 and the second pressed body W2, and the support plate 12 together with the conductive plate 11 is elastically deformed, it is possible to bring the first contact portion 13 and the second contact portion 14 of the conductive plate 11 into strong contact with the first pressed body W1 and the second pressed body W2, respectively, and to stably exhibit characteristics such as electrical conductivity and heat transferability that the conductive plate 11 mainly has as designed.

Since the support plate 12 is provided with the third contact portion 15 that contacts the second contact portion 14 of the conductive plate 11, and the second contact portion 14 is sandwiched between the third contact portion 15 and the second pressed body W2 in the first direction Z, it is possible to reliably bring the second contact portion 14 into strong contact with the second pressed body W2, and to reliably stabilize the contact state of the conductive plate 11 with respect to the first pressed body W1 and the second pressed body W2.

Since the spring member 1 includes the conductive plate 11, and the surface of the support plate 12 is not plated with the same material as the conductive plate 11 (or does not have to be plated with the same material as the conductive plate 11), it is possible to easily secure at least one of the electrical conductivity and the thermal conductivity to be high, and without peeling of the plating, to exhibit the above-described characteristics as designed for a long period of time.

Since the two end portions of the conductive plate 11 in the second direction X are movably engaged with the two end portions of the support plate 12 in the second direction X, it is possible to move the two end portions of the support plate 12 in the second direction X relative to the two end portions of the conductive plate 11 in the second direction X according to the elastic deformation of the spring member 1, and to improve the durability thereof compared with, for example, a case where the two end portions of the support plate 12 in the second direction X are fixed to the two end portions of the conductive plate 11 in the second direction X.

Since the two end portions of the other of the conductive plate 11 or the support plate 12 in the second direction X are movably inserted through the through-holes 16 provided in the two end portions of the either one of the conductive plate 11 or the support plate 12 in the second direction X, it is possible to easily and movably engage the two end portions of the conductive plate 11 in the second direction X with the two end portions of the support plate 12 in the second direction X.

Since the sizes of the through-holes 16 in the third direction Y decrease toward the intermediate portion in the second direction, in either one of the conductive plate 11 or the support plate 12, the area of the second contact portion 14 or the third contact portion 15 that receives a pressing force from the second pressed body W2 in the first direction Z can be secured to be wide, and the durability thereof can be improved.

Since the conductive plate 11 is elastically deformed, and the first contact portion 13 and the second contact portion 14 are in pressure contact with the support plate 12 in the first direction Z, even if the conductive plate 11 and the support plate 12 are provided in a non-bonded state to each other on the entire area thereof, it is possible to prevent the conductive plate 11 and the support plate 12 of one spring member 1 from being easily separated from each other, to easily provide the spring member 1 between the first pressed body W1 and the second pressed body W2, and to improve each rigidity of the first contact portion 13 and the second contact portion 14 that receive a pressing force in the first direction Z.

The technical scope of the present invention is not limited to the above embodiment, and various modifications can be made within the scope of the present invention.

Figure 5:
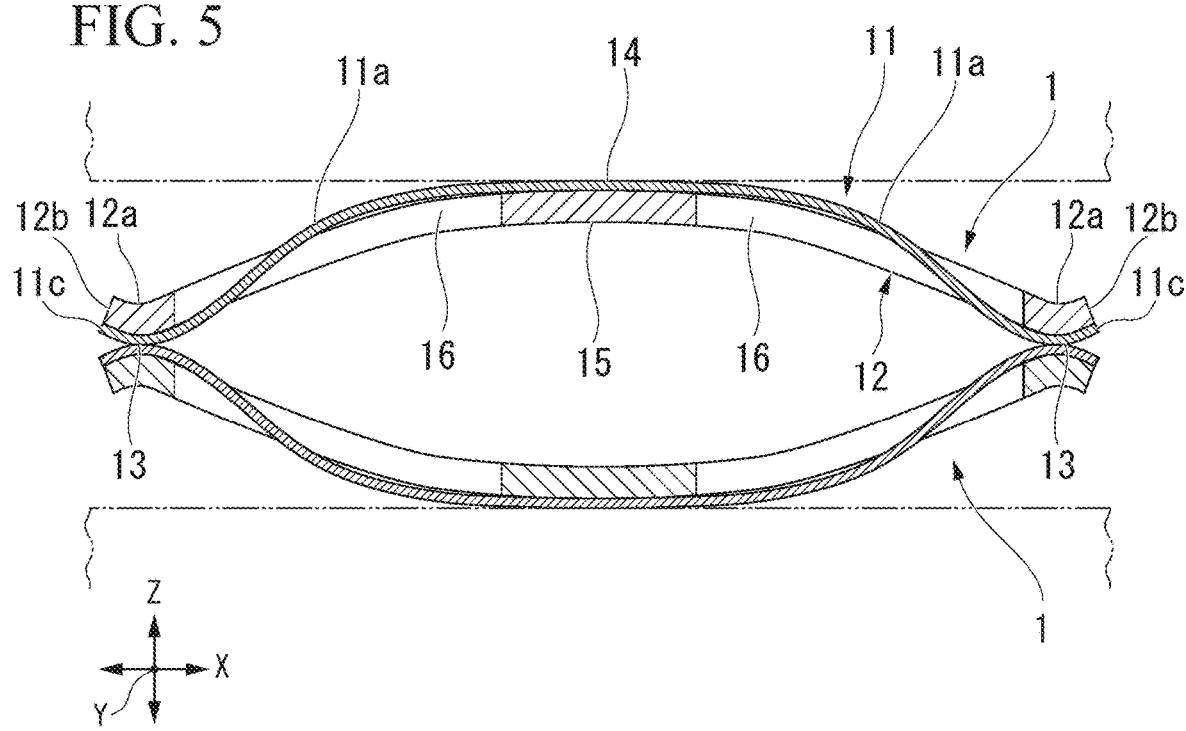
FIG. 5 is a diagram showing a first modification of the mode of use of the spring member in FIG. 1.

For example, as shown in FIG. 5, two spring members 1 may be provided between the first pressed body W1 and the second pressed body W2 in a state where the orientations of the two spring members 1 in the first direction Z are opposite to each other, and the first contact portions 13 of the two spring members 1 are in contact with each other in the first direction Z.

In this case, the first contact portion 13 of one spring member 1 contacts the first pressed body W1 through the conductive plate 11 of the other spring member 1. At the time the two spring members 1 are elastically deformed in the first direction Z, the first contact portions 13 of the two spring members 1 that contact each other in the first direction Z can be shifted together in the second direction X without rubbing each other, and a large amount of elastic deformation thereof in the first direction Z can be secured.

Figure 6:
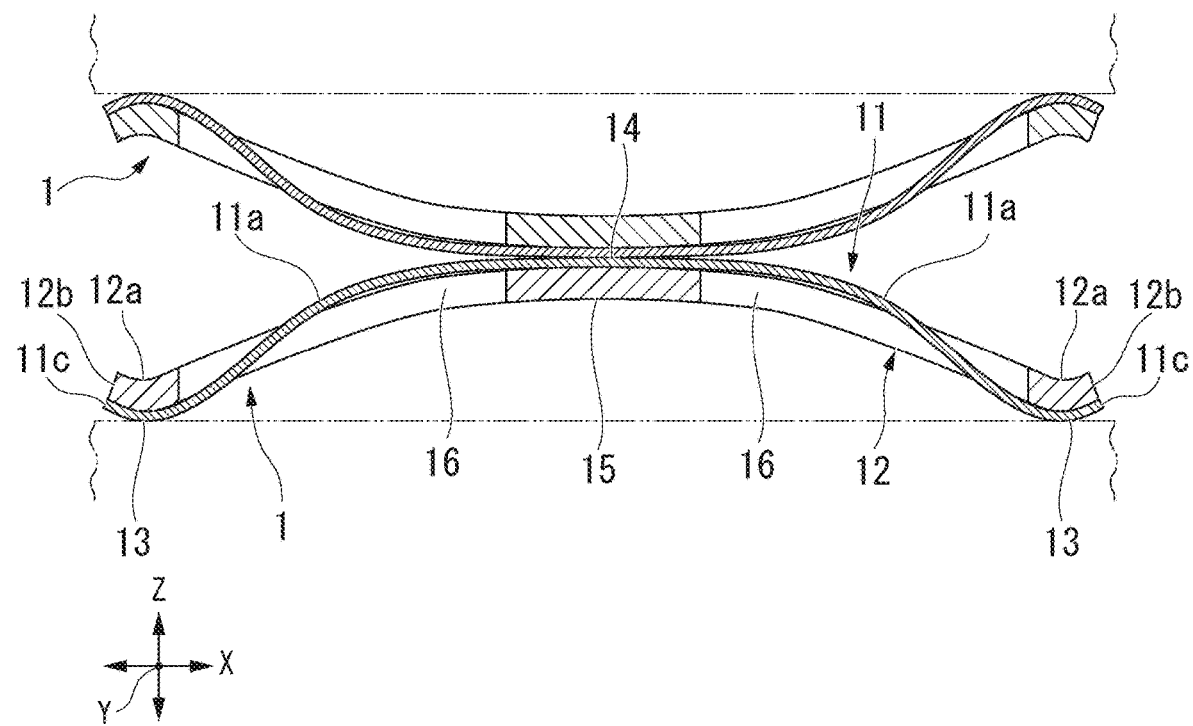
FIG. 6 is a diagram showing a second modification of the mode of use of the spring member in FIG. 1.

As shown in FIG. 6, two spring members 1 may be provided between the first pressed body W1 and the second pressed body W2 in a state where the orientations of the two spring members 1 in the first direction Z are opposite to each other, and the second contact portions 14 of the two spring members 1 are in contact with each other in the first direction Z.

In this case, the second contact portion 14 of one spring member 1 contacts the second pressed body W2 through the conductive plate 11 of the other spring member 1, and a large amount of elastic deformation thereof in the first direction Z can be secured.

Three or more spring members 1 may be provided between the first pressed body W1 and the second pressed body W2, the orientations of the spring members 1 next to each other in the first direction Z may be opposite to each other, and the first contact portions 13 or the second contact portions 14 of the spring members 1 next to each other in the first direction Z may be brought into contact with each other in the first direction Z.

A spring member 2 may be adopted in which the shapes of the conductive plate 11 and the support plate 12 shown in FIGS. 3 and 4 are interchanged with each other.

Figure 7:
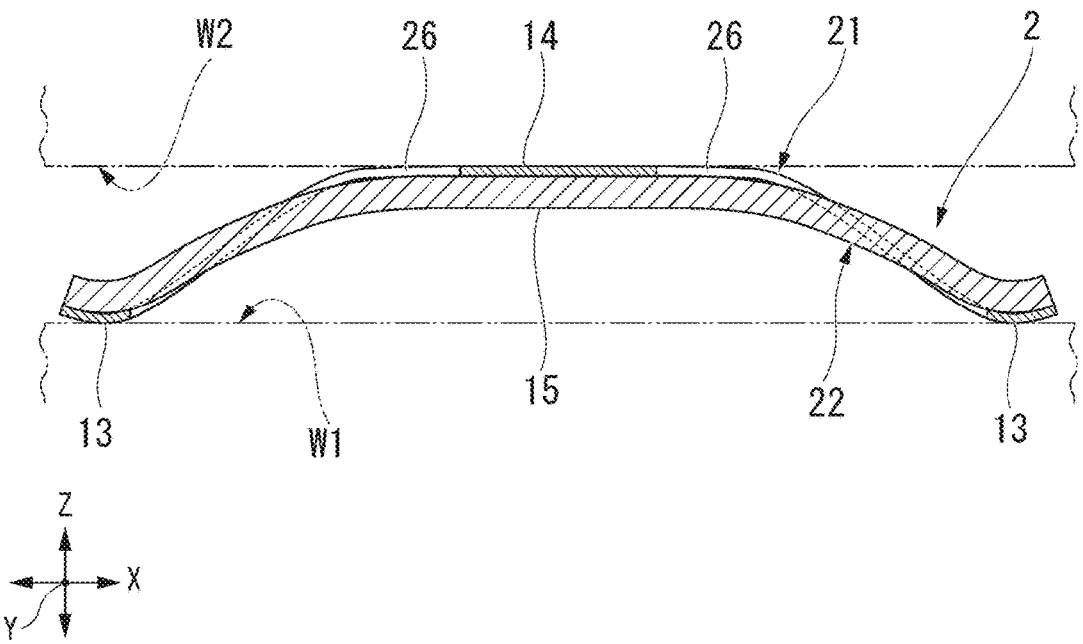
FIG. 7 is a cross-sectional view in a first direction and a second direction of a spring member shown as a first modification of the embodiment.

That is, when FIG. 3 shows a support plate 22 including the third contact portion 15 instead of the first contact portions 13 and the second contact portion 14, and FIG. 4 shows a conductive plate 21 including the first contact portions 13 and the second contact portion 14 instead of the third contact portion 15, as shown in FIG. 7, in a state where an intermediate portion of the conductive plate 21 in the second direction X is positioned to be closer to the other side than an intermediate portion of the support plate 22 in the second direction X, two end portions of the support plate 22 in the second direction X may be inserted through through-holes 26 of the conductive plate 21 from the inner side toward the outer side in the second direction X.

A configuration without the through-hole 16 or 26 may be adopted as the spring members 1 and 2.

Figure 8:
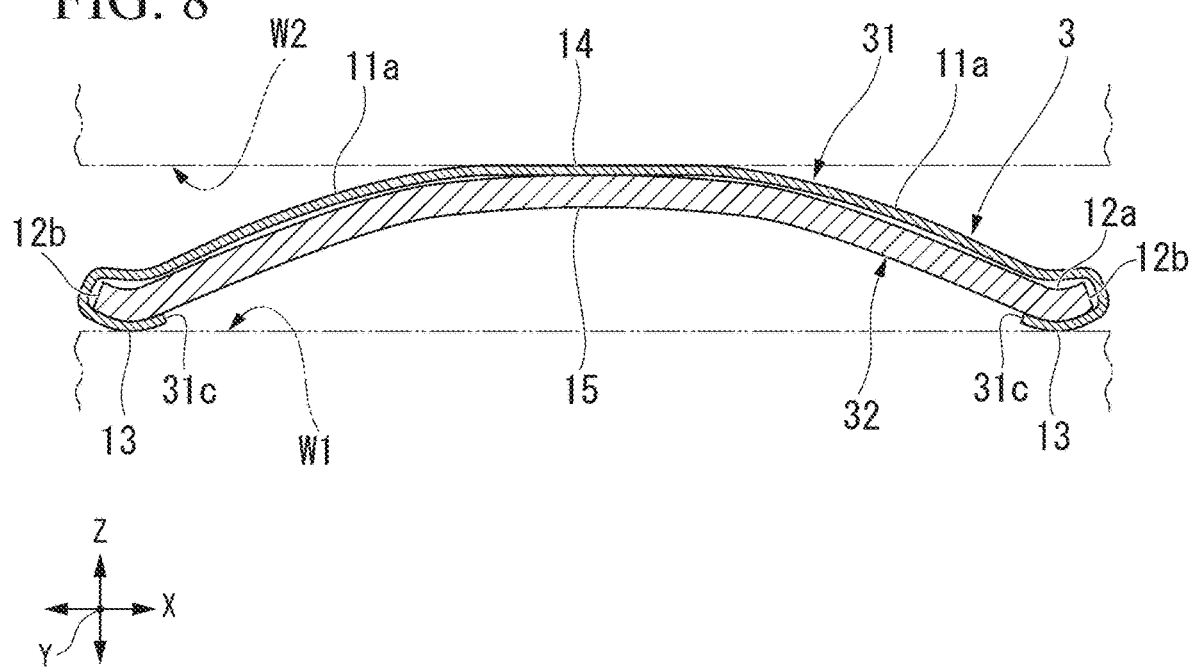
FIG. 8 is a cross-sectional view in the first direction and the second direction of a spring member shown as a second modification of the embodiment.

For example, as shown in FIG. 8, a spring member 3 may be adopted in which the size of a conductive plate 31 in the second direction X is made to be greater than the size of a support plate 32 in the second direction X, the surface of the support plate 32 facing the other side is covered by the conductive plate 31 on the entire length thereof in the second direction X, and open edges 12b of the support plate 32 in the second direction X are covered by two end portions of the conductive plate 31 in the second direction X from the other side to the one side so that the two end portions of the conductive plate 31 in the second direction X are wrapped around two end portions of the support plate 32 in the second direction X.

In the spring member 3, the two end portions of the conductive plate 31 in the second direction X clamp, in the first direction Z, the two end portions of the support plate 32 in the second direction X, and the two end portions of the support plate 32 in the second direction X are fixed to the two end portions of the conductive plate 31 in the second direction X. In the spring member 3, at the first contact portion 13, an open edge 31c of the conductive plate 31 in the second direction X extends in the second direction X so as to face the inner side in the second direction X.

In the spring member 3, a configuration may be adopted in which a plurality of conductive plates 31, the size of each conductive plate 31 in the third direction Y is less than that of the support plate 32, are provided in one support plate 32 at intervals in the third direction Y, a configuration may be adopted in which a member obtained by connecting a plurality of conductive plates 31 through the connection piece 11b in the third direction Y, the size of each conductive plate 31 in the third direction Y is less than that of the support plate 32, is provided in one support plate 32, and a configuration may be adopted in which one conductive plate 31 whose size in the third direction Y is slightly less than or equivalent to that of the support plate 32 is provided in one support plate 32.

The two end portions of the support plate 12, 22 or 32 in the second direction X may be fixed to the two end portions of the conductive plate 11, 21 or 31 in the second direction X by, for example, brazing.

Figure 9:
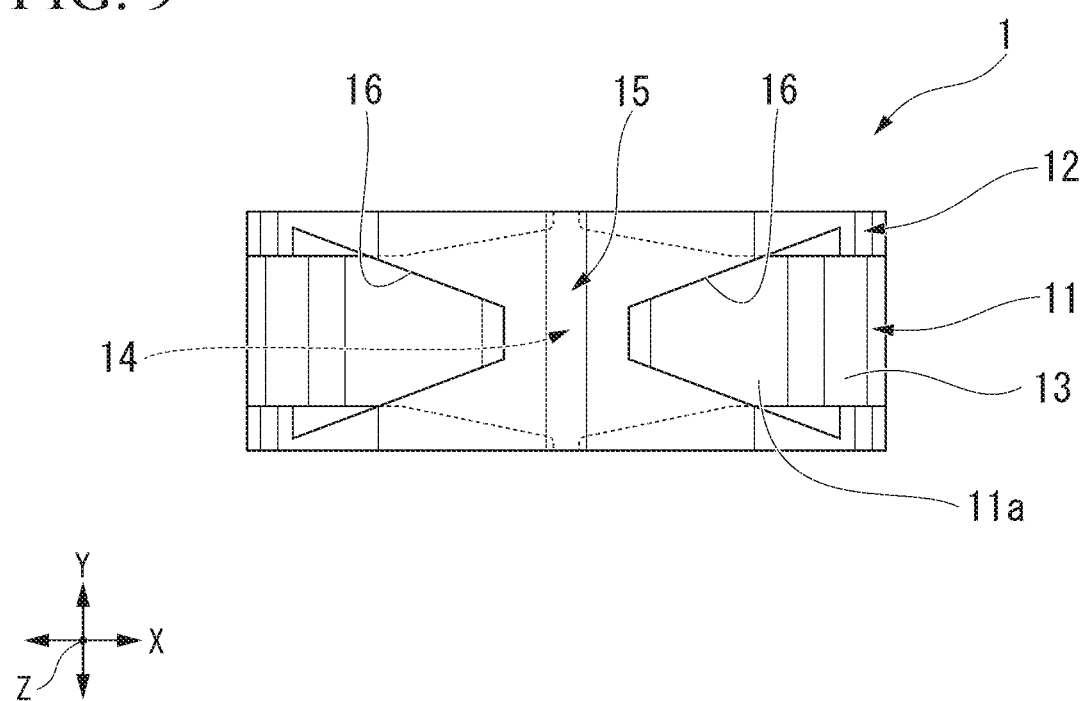
FIG. 9 is a plan view of a spring member shown as a third modification of the embodiment and viewed from one side in one direction.

As the spring members 1, 2 and 3, a configuration is shown in which a plurality of conductive plates 11, 21 or 31 are provided to be connected together in the third direction Y and a plurality of support plates 12, 22 or 32 are provided to be connected together in the third direction Y, but a configuration as, for example, a spring member 1 shown in FIG. 9 may be adopted in which one conductive plate 11, 21 or 31 and one support plate 12, 22 or 32 are provided, and a configuration may be adopted in which a plurality of conductive plates 11, 21 or 31 and a plurality of support plates 12, 22 or 32 are provided.

As the spring members 1, 2 and 3, for example, a configuration may be adopted in which, in an integrally formed member obtained by connecting a plurality of support plates 12, 22 or 32 together in the third direction Y, a plurality of conductive plates 11, 21 or 31, the number of the plurality of conductive plates 11, 21 or 31 is less than that of the plurality of support plates 12, 22 or 32, are provided, and a configuration may be adopted in which, in an integrally formed member obtained by connecting a plurality of support plates 12, 22 or 32 together in the third direction Y, both of a plurality of conductive plates 11, 21 or 31 connected through the connection piece 11b and a single conductive plate 11, 21 or 31 are provided.

A configuration may be adopted in which, in an integrally formed member obtained by connecting a plurality of conductive plates 11, 21 or 31 together in the third direction Y, a plurality of support plates 12, 22 or 32, the number of the plurality of support plates 12, 22 or 32 is less than that of the plurality of conductive plates 11, 21 or 31, are provided, and a configuration may be adopted in which, in an integrally formed member obtained by connecting a plurality of conductive plates 11, 21 or 31 together in the third direction Y, both of a plurality of support plates 12, 22 or 32 integrally formed to be connected together in the third direction Y and a single support plate 12, 22 or 32 are provided.

Hereinafter, examples in which the spring members 1, 2 and 3 of the above embodiment are applied to other structures are described. Although the term "spring member 1" is used below for convenience, any one of the spring members 1, 2 and 3 can be applied to the following examples. The second direction X, the third direction Y, and the first direction Z described in the above embodiment are also used for the following examples, and the relationships between the second direction X, the third direction Y, and the first direction Z, and the spring member 1 are the same as in the above embodiment.

Example 1

An example 1 in which the spring member 1 of the above embodiment is applied to a connection terminal structure 40 is described with reference to FIGS. 10 to 14.

The connection terminal structure 40 is configured as a female terminal that can be electrically connected (conduct) to a terminal 45 described below and includes a frame body 41 and two spring members 1 of the above embodiment.

The frame body 41 includes a first frame member 42 and a second frame member 43 each formed in a U-shape when viewed in the second direction X. The first frame member 42 and the second frame member 43 have equivalent configurations to each other. The first frame member 42 includes a flat plate-shaped bottom wall portion 42a, and side wall portions 42b connected to two end portions of the bottom wall portion 42a in the third direction Y and protruding in the first direction Z. Similarly, the second frame member 43 includes a flat plate-shaped bottom wall portion 43a, and side wall portions 43b connected to two end portions of the bottom wall portion 43a in the third direction Y and protruding in the first direction Z. The first frame member 42 and the second frame member 43 are connected to each other in orientations that the inner spaces thereof face each other. That is, the two side wall portions 42b of the first frame member 42 are in contact with the two side wall portions 43b of the second frame member 43, and a space is provided inside the frame body 41. At least one of two ends in the second direction X of the first frame member 42 and the second frame member 43 is open in the second direction X, and on this one side, the inner space of the frame body 41 communicates with the outside. The other of the two ends in the second direction X of the first frame member 42 and the second frame member 43 may be open in the second direction X or may be provided with a wall (not shown). Both of the first frame member 42 and the second frame member 43 are formed of electrically conductive materials. The materials forming the first frame member 42 and the second frame member 43 are not particularly limited as long as they are electrically conductive materials, and examples thereof include metals such as copper and aluminum. The first frame member 42 and the second frame member 43 of the example 1 are electrically connected to each other by the side wall portions that face each other contacting each other.

Figure 10:
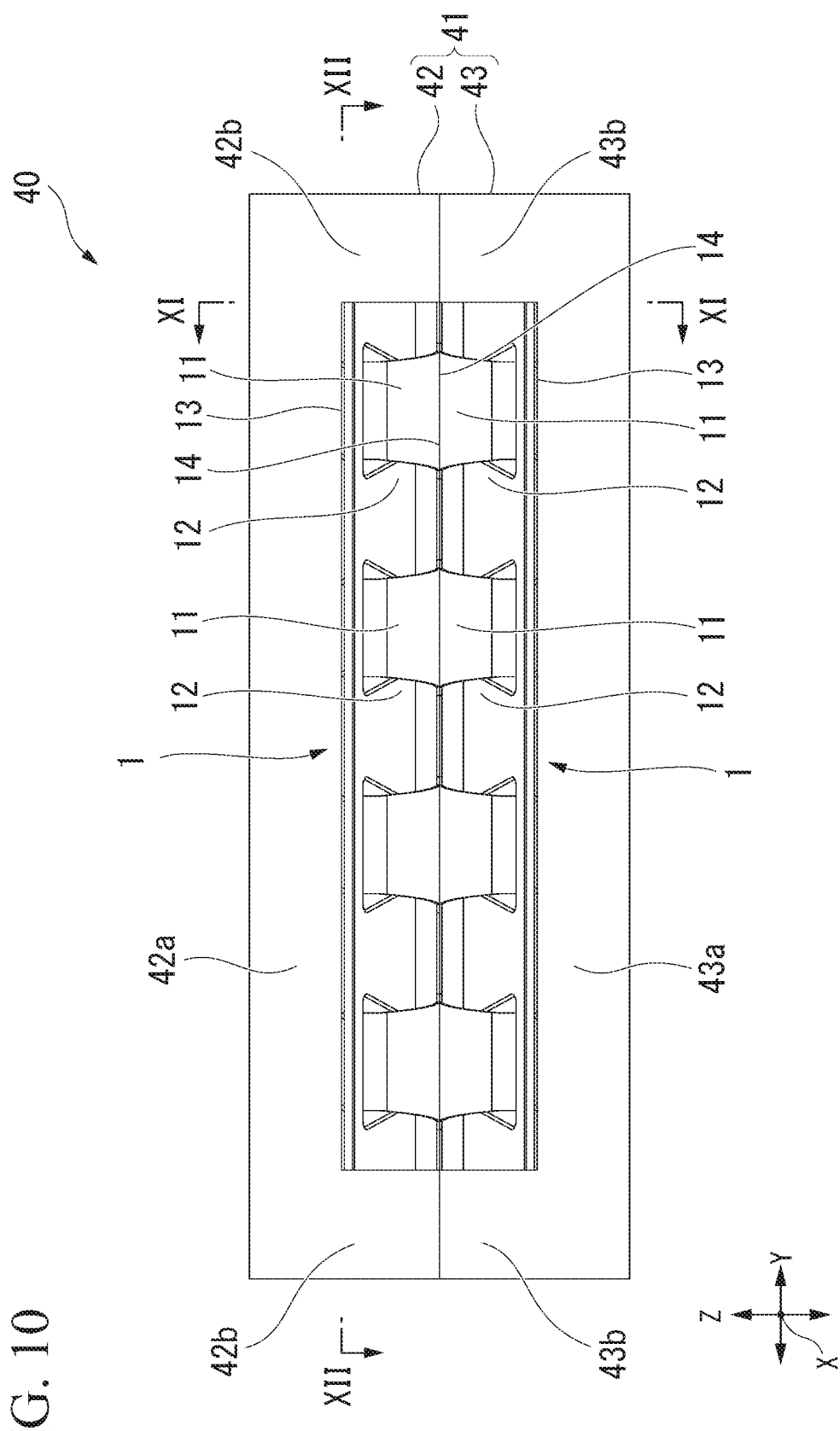
FIG. 10 is a front view of a connection terminal structure of an example 1.
Figure 11:
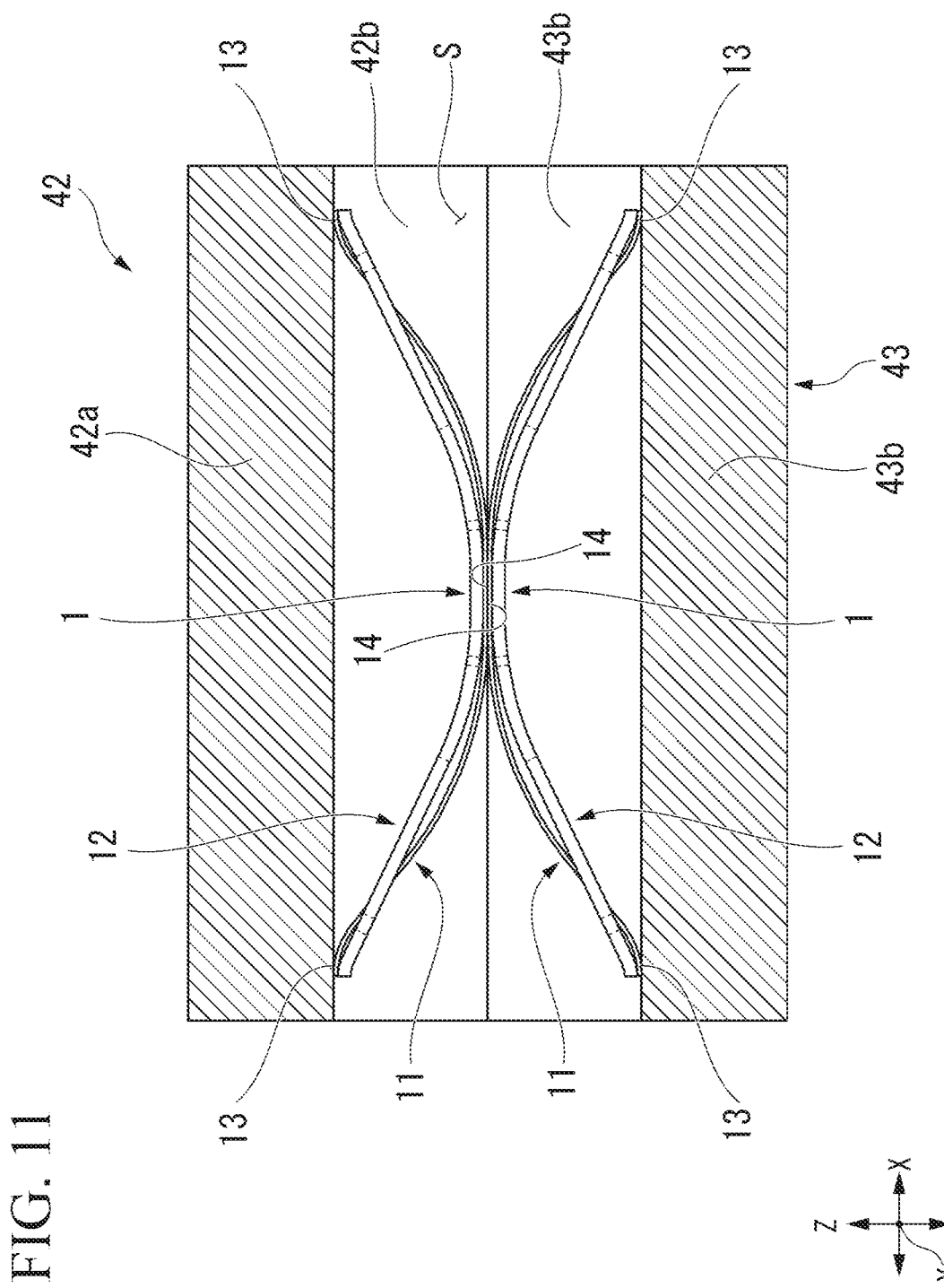
FIG. 11 is a cross-sectional view taken along line XI-XI and viewed in arrow direction in FIG. 10.

The two spring members 1 are disposed in the inner space of the frame body 41. In each spring member 1 of the example 1, four conductive plates 11 are arranged in the third direction Y, but the number of the conductive plates 11 may be other than four. Four support plates 12 are arranged in the third direction Y, but the number of the support plates 12 may be other than four. The two spring members 1 are disposed in the inner space of the frame body 41 such that the orientations thereof are opposite to each other in the first direction Z and the second contact portions 14 thereof face and contact each other. When viewed in the first direction Z, the two spring members 1 are disposed to overlap each other (refer to FIG. 12). One spring member 1 of the two spring members 1 is accommodated in the inner space (space inside the U-shape) of the first frame member 42, the first contact portion 13 of the one spring member 1 is in contact with and electrically connected to the inner surface (surface facing the inner space) of the bottom wall portion 42a, the other spring member 1 is accommodated in the inner space (space inside the U-shape) of the second frame member 43, and the first contact portion 13 of the other spring member 1 is in contact with and electrically connected to the inner surface (surface facing the inner space) of the bottom wall portion 43a. As shown in FIGS. 10 and 11, in a state where the terminal 45 described below is not electrically connected to the connection terminal structure a configuration may be used in which the second contact portions 14 of the two spring members 1 are in contact with each other, or a configuration may be used in which the second contact portions 14 of the two spring members 1 are spaced apart from each other.

Figure 13:
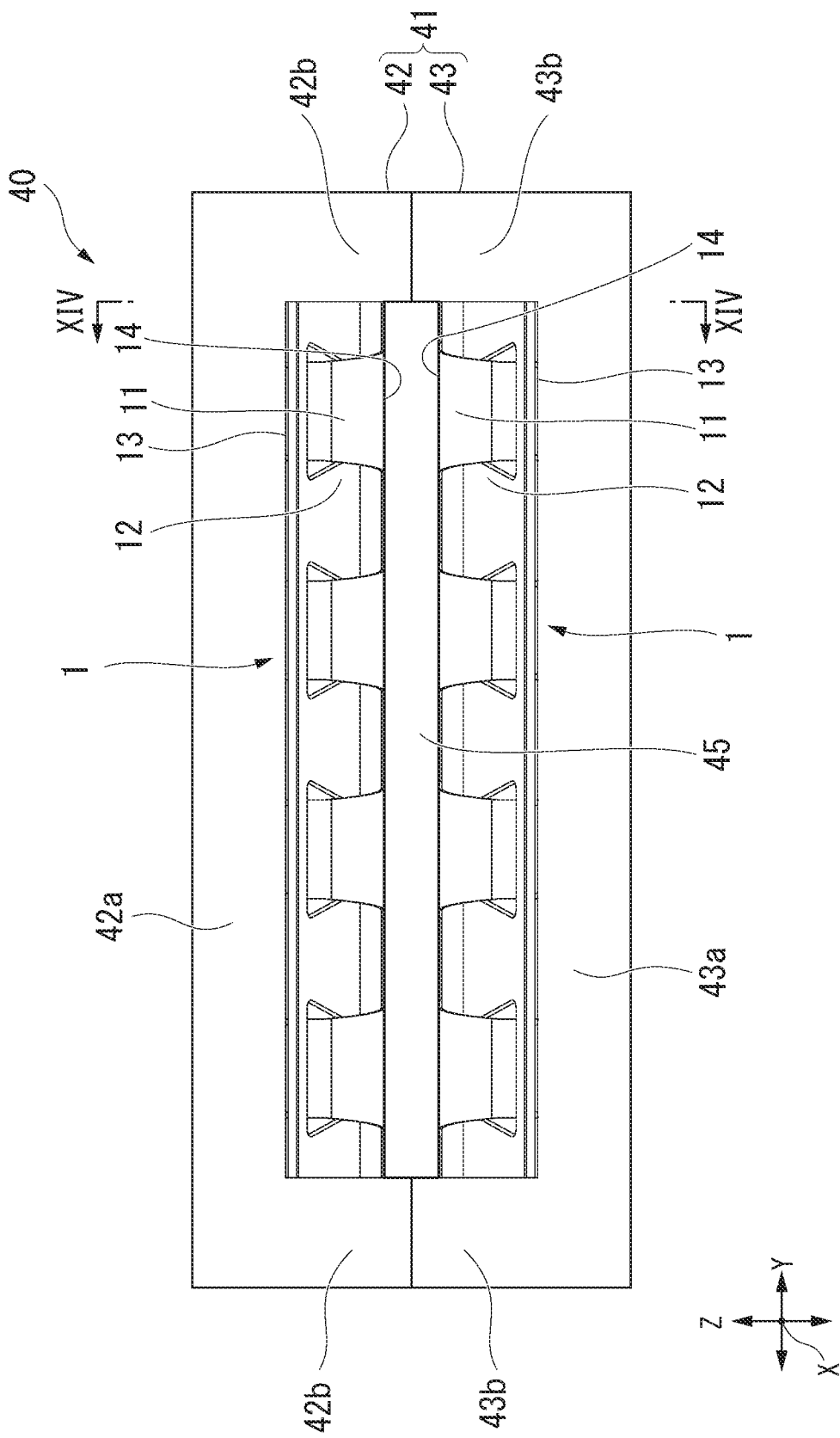
FIG. 13 is a front view of the connection terminal structure and showing a state where a terminal is inserted therein.
Figure 14:
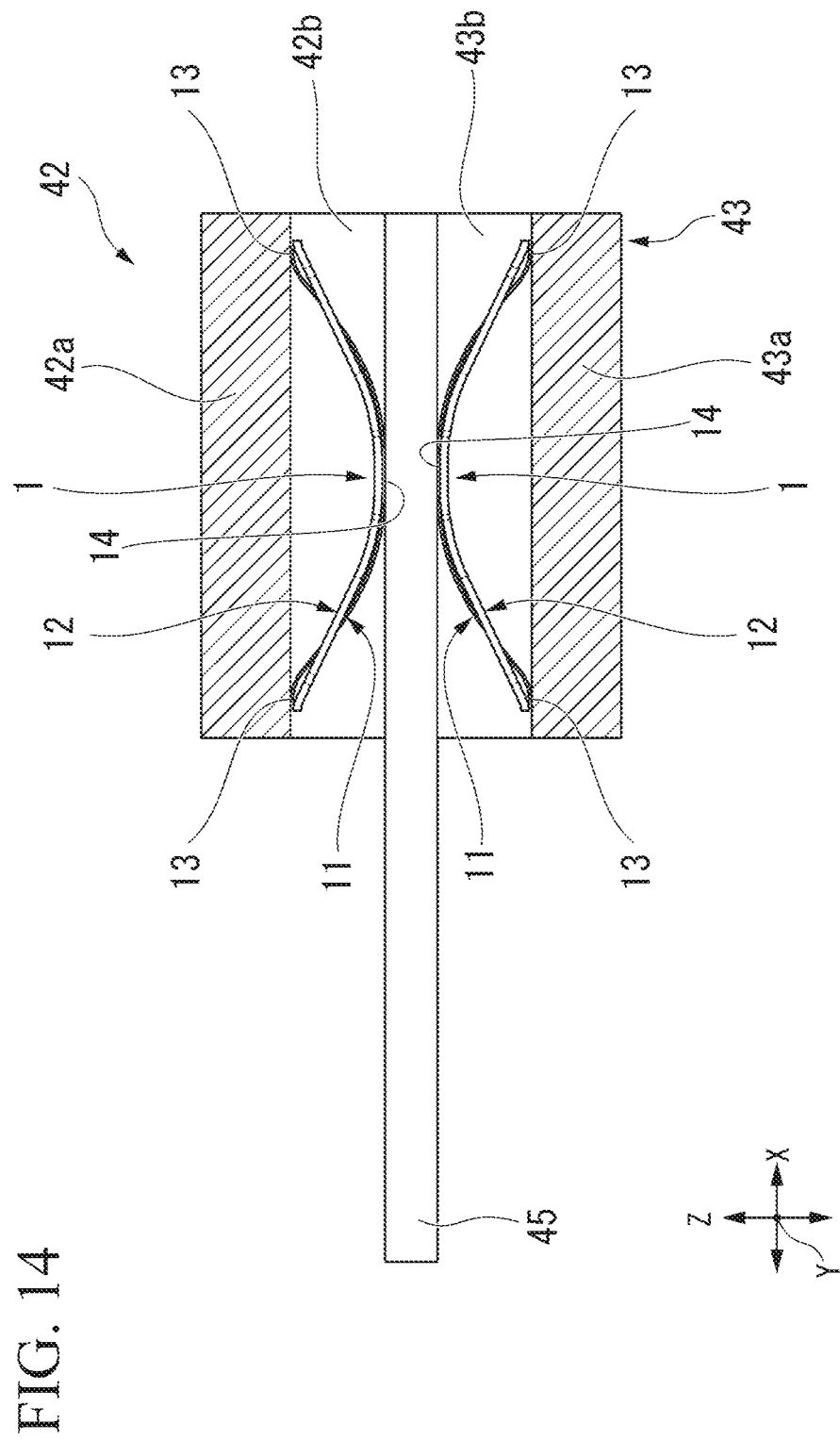
FIG. 14 is a cross-sectional view taken along line XIV-XIV and viewed in arrow direction in FIG. 13.

As shown in FIGS. 13 and 14, the connection terminal structure 40 of the example 1 is configured such that the plate-shaped terminal 45 can be disposed between the two spring members 1. The terminal 45 is configured as a male terminal that can be inserted between the two spring members 1 and is formed of, for example, an electrically conductive material such as copper and aluminum into a rectangular plate shape. The shape of the terminal 45 is not limited to a rectangular plate shape but may be a columnar shape or a comb teeth member in which a plurality of rod-shaped members extending in the second direction X are arranged in the third direction Y. The terminal 45 may have a structure in which an electrically conductive layer is provided on the outer surface of a member formed of an insulating material by, for example, plating. The terminal 45 of the example 1 has a configuration in which the surfaces thereof on the one side and the other side in the first direction Z are electrically connected.

The sum of the thickness in the first direction Z of the two spring members 1 to which no load is applied and the thickness of the terminal 45 in the first direction Z is greater than the size (that is, the distance between the inner surface of the bottom wall portion 42a and the inner surface of the bottom wall portion 43a in the first direction Z) of the inner space of the frame body 41 in the first direction Z. Therefore, in a state where the terminal 45 is disposed between the two spring members 1, the two spring members 1 are compressed and deformed and apply a pressing force based on this compression to the terminal 45 and the frame body 41 (the first frame member 42 and the second frame member 43).

A procedure for electrically connecting the terminal 45 to the connection terminal structure 40 is described with reference to FIGS. 10 to 14.

Figure 12:
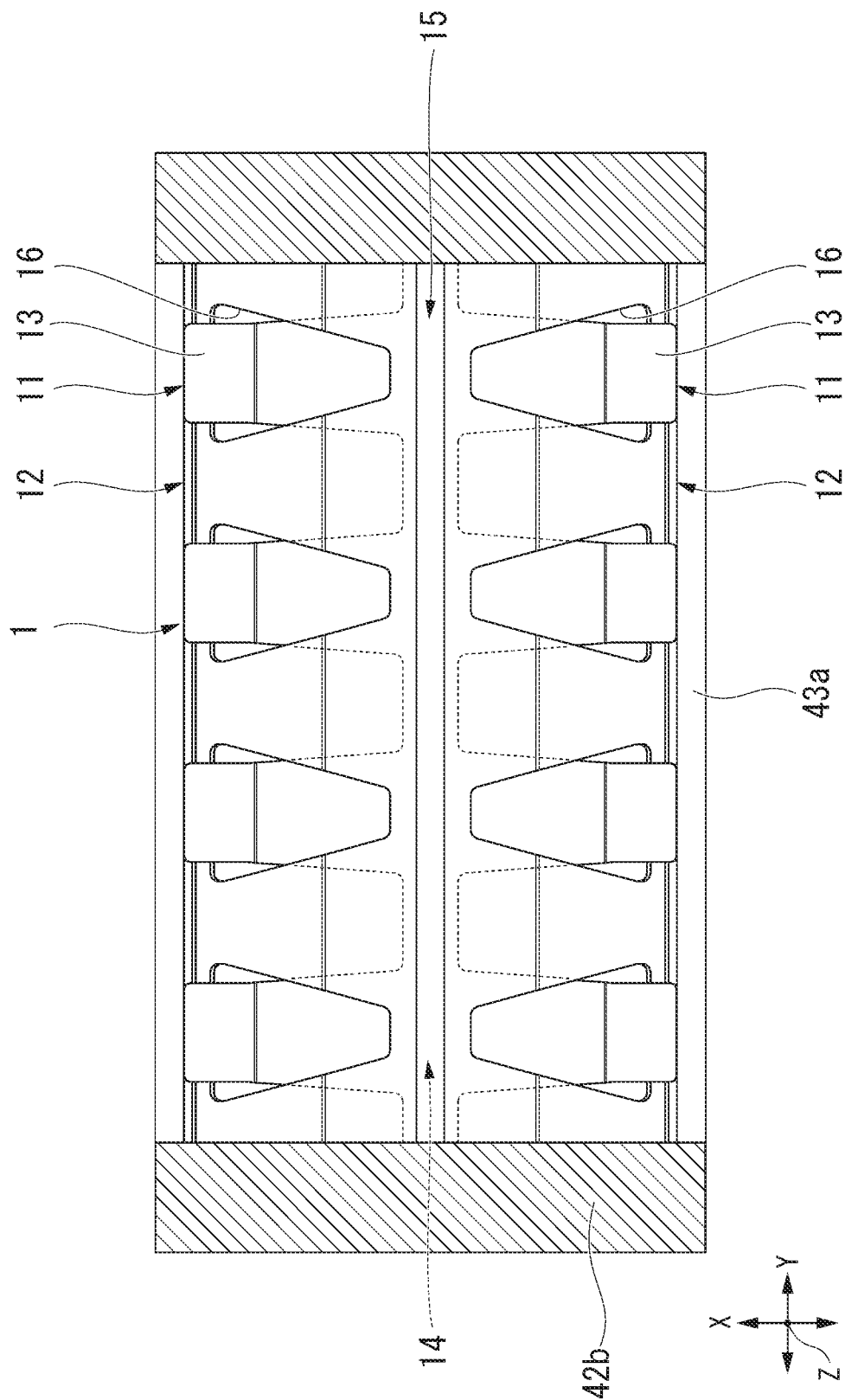
FIG. 12 is a cross-sectional view taken along line XII-XII and viewed in arrow direction in FIG. 10.

With respect to the connection terminal structure 40 shown in FIGS. 10 to 12 into which the terminal 45 is not inserted, the terminal 45 is moved toward the second contact portions 14 of the two spring members 1 in the second direction X. Since the two spring members 1 are curved or bent so as to protrude toward each other, the moving terminal 45 is brought into contact with curved or inclined surfaces of the two spring members 1, when the terminal 45 is further moved in the second direction X, the two spring members 1 receive force in directions away from each other from the terminal 45, and the two second contact portions 14 contacting each other are separated from each other. When the distance between the two second contact portions 14 in the first direction Z is greater than or equal to the thickness of the terminal 45 in the first direction Z, the terminal 45 is inserted between the two spring members 1, and the two second contact portions 14 are brought into contact with front and rear surfaces of an intermediate portion (portion other than two end portions of the terminal 45 in the second direction X) of the terminal 45 in the second direction X.

As described above, the first contact portion 13 of one spring member 1 of the two spring members 1 is in contact with and electrically connected to the inner surface of the bottom wall portion 42a, the first contact portion 13 of the other spring member 1 thereof is in contact with and electrically connected to the inner surface of the bottom wall portion 43a, and thus the first frame member 42, the conductive plate 11 of the one spring member 1, and the surface of the terminal 45 on one side are electrically connected, and the second frame member 43, the conductive plate 11 of the other spring member 1, and the surface of the terminal 45 on the other side are electrically connected. Since a configuration is used in which the first frame member 42 and the second frame member 43 of the example 1 are electrically connected to each other and the surfaces on the one side and the other side of the terminal 45 in the first direction Z are electrically connected, when the terminal 45 is inserted into the connection terminal structure 40, the first frame member 42, the second frame member 43, the two spring members 1, and the terminal 45 are electrically connected. In this way, the electrical connection between the connection terminal structure 40 and the terminal 45 is completed.

As described in the above embodiment, in one of the present invention, the conductive plate 11 and the support plate 12 are formed of different bodies, so the required electrical conductivity (or the required electrical conductivity and heat transferability) can be secured by the conductive plate 11, and appropriate elastic force and pressing force can be obtained by the support plate 12. Therefore, the support plate 12 can provide appropriate elastic force and pressing force according to the mechanical strength of the terminal 45, for example, even when vibrations are applied to the connection terminal structure 40 and the terminal 45 connected together, and the position and orientation of the terminal 45 relative to the connection terminal structure 40 is slightly changed, it is possible to prevent excessive force from being applied to the terminal 45 and to limit the terminal 45 from being damaged. Even if a structure is used in which the relative position in the second direction X between the connection terminal structure 40 and the terminal 45 is changed while the electrical connection therebetween is maintained (for example, a case of being used for joint portions of robots or the like), similarly, it is possible to prevent excessive force from being applied to the terminal 45 and to limit the terminal 45 from being damaged.

When breaking the electrical connection between the connection terminal structure 40 and the terminal 45, the terminal 45 is moved away from the connection terminal structure 40 in the second direction X and is separated from a position between the two spring members 1. Thereby, the second contact portions 14 and the terminal 45 are separated from each other, and the electrical connection between the connection terminal structure 40 and the terminal 45 is broken.

The following configurations may be applied to the above example 1.

In the above example 1, the first frame member 42 and the second frame member 43 of the frame body 41 are formed of different bodies, but the first frame member 42 and the second frame member 43 may be integrally formed.

In the above example 1, a configuration may be used in which one of the first frame member 42 and the second frame member 43 has no side wall portion, and the bottom wall portion of the one is connected to the side wall portions of the other of the first frame member 42 and the second frame member 43.

In the above example 1, a connection terminal mechanism may be configured by including the connection terminal structure 40 and the terminal 45.

In the above example 1, any fixing structure for fixing the spring member 1 to the frame body 41 may be used. Examples of the fixing structure include brazing, welding, adhesion, and fastening structures such as screws.

In the above example 1, the two spring members 1 are provided in the inner space of the frame body 41, but only one spring member 1 may be provided inside the frame body 41. For example, a configuration may be used in which one spring member 1 is accommodated inside the first frame member 42 such that the first contact portion 13 thereof is in contact with the inner surface of the bottom wall portion 42a, the spring member 1 is not provided on the second frame member 43 side, when the terminal 45 is inserted into the connection terminal structure 40, the first frame member 42, the conductive plate 11 of the one spring member 1, and the surface of the terminal 45 on one side are electrically connected, and the second frame member 43 and the surface of the terminal 45 on the other side are electrically connected. That is, a configuration may be used in which the inner surface of the bottom wall portion 43a and the surface of the terminal 45 on the other side are electrically connected.

In a case where only one spring member 1 is provided inside the frame body 41, that is, is disposed inside the first frame member 42, the second frame member 43 that is in direct contact with the terminal 45 may be formed of an electrical insulating material (hereinafter, simply referred to as an insulating material) such as resin.

An object of the above example 1 is to electrically connect the connection terminal structure 40 and the terminal 45, but in addition to or instead of this object, a configuration may be used for securing heat transferability between the connection terminal structure 40 and the terminal 45, for example, for dissipating heat possessed by one of the connection terminal structure 40 and the terminal 45 through the other thereof. For example, as a configuration in which both electrical conductivity and heat transferability are obtained, a configuration may be used in which the surface of the terminal 45 on one side in the first direction Z is formed of an electrical conductive material, the surface of the terminal 45 on the other side is formed of an insulating material, when the terminal 45 is inserted into the connection terminal structure 40, the first frame member 42, the conductive plate 11 of one spring member 1, and the surface of the terminal 45 on the one side are electrically connected, but the second frame member 43, the conductive plate 11 of the other spring member 1, and the surface of the terminal 45 on the other side are not necessarily electrically connected but are connected so as to secure heat transferability, thereby dissipating the heat of the terminal 45 through the other spring member 1 to the second frame member 43. A configuration may be used in which when electrical conduction through the first frame member 42, the conductive plate 11 of the one spring member 1, and the surface of the terminal 45 on the one side generates heat, the heat is dissipated to the second frame member 43. In this case, the second frame member 43 and the conductive plate 11 of the other spring member 1 may be formed of insulating materials, or the first frame member 42 and the second frame member 43 may be electrically insulated. In order to electrically insulate the first frame member 42 and the second frame member 43, an insulating material may be sandwiched therebetween, or they may be spaced apart from each other. When the second frame member 43 is made to be the heat dissipation side, for example, the second frame member 43 may be provided with a cooling structure. Examples of the cooling structure include a heat sink, and a structure using a cooling pipe through which a cooling fluid flows.

In the above example 1, a configuration is used in which the surfaces of the terminal 45 on one side and the other side in the first direction Z are electrically connected. However, a configuration may be used in which while the surfaces of the terminal 45 on one side and the other side in the first direction Z are formed of electrically conductive materials, these surfaces are insulated, and the first frame member 42 and the second frame member 43 are insulated. In order to insulate the surfaces of the terminal 45 on one side and the other side in the first direction Z, there is a structure in which an insulating material is sandwiched between two electrically conductive materials, and this structure may be formed by, for example, plating or the like. In this case, when the terminal 45 is inserted into the connection terminal structure 40, as a first system, the first frame member 42, the conductive plate 11 of one spring member 1, and the surface of the terminal 45 on one side are electrically connected, and as a second system, the second frame member 43, the conductive plate 11 of the other spring member 1, and the surface of the terminal 45 on the other side are electrically connected, but the first and second systems are insulated from each other, and thus the electrical connections of the two systems can be secured.

In the above example 1, the terminal 45 is moved in the second direction X and is inserted between the two spring members 1 of the connection terminal structure 40, but a configuration may be used in which the terminal 45 is moved in the third direction Y and is inserted between the two spring members 1. In this case, the positions of the side wall portions 42b and 43b may be changed such that the terminal 45 can be inserted. The second contact portions 14 of the two spring members 1 are in contact with each other before the terminal 45 is inserted, but a structure may be appropriately adopted to allow the terminal 45 to be inserted in the third direction Y. For example, a configuration may be used in which a protrusion (not shown) is provided on an end surface of the terminal 45, the protrusion can be inserted into a space S next to the second contact portion 14 shown in FIG. 11 in the second direction X, when the terminal 45 is moved toward the connection terminal structure 40 in the third direction Y, the protrusion is first inserted into the space S, the two spring members 1 are pushed by the protrusion to be separated from each other by further moving the terminal 45, and thus the terminal 45 can be inserted between the two spring members 1. A configuration may be used in which a plate-shaped member (hereinafter, referred to as an insulating plate) formed of an insulating material and having a thickness equivalent to that of the terminal 45 in the first direction Z is disposed in advance between the two spring members 1, the terminal 45 is moved toward the connection terminal structure 40 in the third direction Y to push and move the insulating plate, then the terminal 45 is disposed instead of the insulating plate in a position in which the insulating plate was disposed, and thus the connection terminal structure 40 and the terminal 45 are electrically connected. When the insulating plate is used, a mechanism may be provided for returning the insulating plate to a position between the two spring members 1 at the time the terminal 45 is separated from the connection terminal structure 40.

Modification of Example 1

A modification of the above example 1 is described below.

An object of the above example 1 is to secure electrical connection (or electrical connection and heat transfer) between the connection terminal structure 40 and the terminal 45, but while using a configuration similar to that of FIGS. 10 to 14, it is also conceivable that the connection terminal structure 40 is used as, for example, a switch.

In this case, the first frame member 42 and the second frame member 43 are electrically insulated. For example, an insulating material may be provided between the first frame member 42 and the second frame member 43, or the first frame member 42 and the second frame member 43 may be spaced apart from each other. The sum of the thicknesses in the first direction Z of the two spring members 1 to which no load is applied is greater than the size of the inner space of the frame body 41 in the first direction Z. Therefore, even when the terminal 45 is not disposed between the two spring members 1, the two spring members 1 are compressed and deformed, and a pressing force based on this compression is applied to the first frame member 42 and the second frame member 43. The second contact portions 14 of the two spring members 1 are in contact with each other. Since the first frame member 42, the second frame member 43, and the conductive plates 11 of the two spring members 1 are formed of electrically conductive materials, in a state where the terminal 45 is not disposed between the two spring members 1, the first frame member 42, the conductive plate 11 of one spring member 1, the conductive plate 11 of the other spring member 1, and the second frame member 43 are electrically connected.

The terminal 45 of this modification has a configuration in which at least the surfaces thereof on one side and the other side in the first direction Z are electrically insulated. In order to obtain this configuration, the entire terminal 45 may be formed of an insulating material, or the surfaces of the terminal 45 on one side and the other side in the first direction Z may be electrically insulated by interposing an insulating material therebetween. In the latter case, at least the surface of the terminal 45 on one side in the first direction Z may be formed of an electrically conductive material.

In the above configuration, in a state where the terminal 45 is not inserted into the connection terminal structure 40, as described above, the first frame member 42, the conductive plate 11 of one spring member 1, the conductive plate 11 of the other spring member 1, and the second frame member 43 are electrically connected. That is, the switch is in the "turned-on" state.

On the other hand, when the terminal 45 is inserted between the two spring members 1 of the connection terminal structure 40, since the surfaces of the terminal 45 on one side and the other side in the first direction Z are electrically insulated, the second contact portions 14 of the two spring members 1 are electrically disconnected, and the electrical connection from the first frame member 42 to the second frame member 43 through the two spring members 1 is broken. That is, the switch is in the "turned-off" state. In this way, it is possible to make the connection terminal structure 40 perform as a switch using the terminal 45.

Example 2

Figure 15:
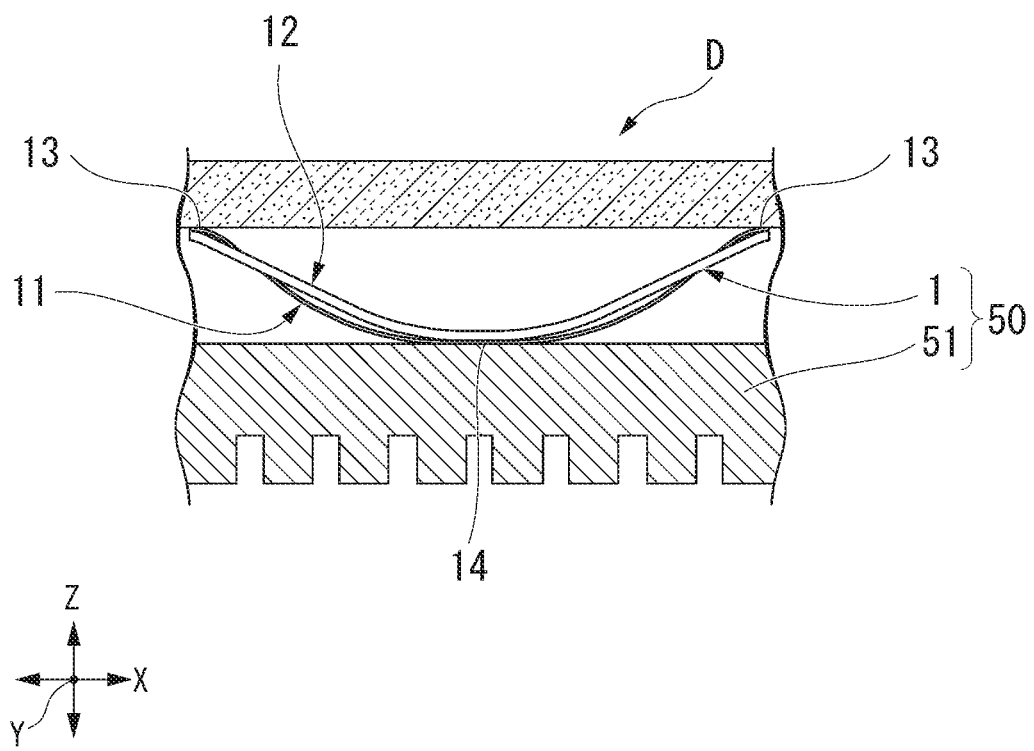
FIG. 15 is a front view of a heat dissipation structure of an example 2.

An example 2 in which the spring member 1 of the above embodiment is applied to a heat dissipation structure 50 is described with reference to FIG. 15.

The heat dissipation structure 50 is a structure for dissipating heat from a semiconductor device D and includes the spring member 1 of the above embodiment and a heat sink 51 connected to the spring member 1.

The semiconductor device D has a structure in which semiconductor elements are covered with an insulating material such as resin, and examples thereof include, for example, a power module that includes power semiconductors and generates heat as it operates.

The heat sink 51 is a member for efficiently releasing heat of the semiconductor device D and has, for example, a comb teeth shape. The material forming the heat sink 51 is not particularly limited as long as it can efficiently dissipate heat, and examples thereof include metals such as aluminum and copper.

The spring member 1 is disposed between the semiconductor device D and the heat sink 51. As shown in FIG. 15, the spring member 1 is disposed to protrude toward the heat sink 51, the first contact portions 13 are in contact with the semiconductor device D, and the second contact portion 14 is in contact with the heat sink 51. The spring member 1 may be disposed to protrude toward the semiconductor device D. The conductive plate 11 of the spring member 1 of the example 2 may have thermal conductivity suitable for at least heat dissipation. A plurality of spring members 1 may be disposed between the semiconductor device D and the heat sink 51.

The structure connecting the semiconductor device D and the heat sink 51 through the spring member 1 is not particularly limited, and a configuration may be used in which the spring member 1 is compressed by the weight of the semiconductor device D (or the heat sink 51), while the repulsive force thereof is applied to the semiconductor device D and the heat sink 51, the connection between the semiconductor device D and the first contact portions 13 and the connection between the second contact portion 14 and the heat sink 51 are secured. In order to hold the spring member 1 in a compressed state between the semiconductor device D and the heat sink 51, the semiconductor device D and the heat sink 51 may be fastened together with a fastening member such as a screw member. When using a screw member, the screw member may be screwed into the heat sink 51 and may be inserted through a through-hole provided in the semiconductor device D so as to be relatively movable, and the head of the screw member may be positioned on a side of the semiconductor device D opposite to the heat sink 51. The spring member 1 may be provided with a through-hole penetrating therein in the first direction Z, and the screw member may be inserted through the through-hole. Only one screw member may be used, or a plurality of screw members may be used. Instead of directly connecting the screw member to the semiconductor device D, the semiconductor device D may be provided on, for example, a plate-shaped holding member, and the holding member and the heat sink 51 may be fastened with the screw member. Other than the screw member, in order to hold the spring member 1 in a compressed state between the semiconductor device D and the heat sink 51, a U-shaped member, a clip member or the like may be used for gripping the semiconductor device D and the heat sink 51 together.

The surface of the heat sink 51 on the spring member 1 side is formed to be flat, and at any position of the surface in the second direction X or the third direction Y, the heat sink 51 can be connected to the second contact portion 14 (or the first contact portion 13) such that heat can be transferred therebetween. The comb teeth shape of the heat sink 51 is provided on the side thereof opposite to the spring member 1. On the other hand, in the semiconductor device D, in order to efficiently dissipate heat from a semiconductor element (for example, a power semiconductor) that generates a large amount of heat, the first contact portion 13 (or the second contact portion 14) of the spring member 1 may be disposed to contact part of the semiconductor device D in the vicinity of the semiconductor element.

As described above, in the spring member 1 of the above embodiment, since the conductive plate 11 and the support plate 12 are formed of different bodies, while the support plate 12 secures appropriate elastic force and pressing force, the conductive plate 11 can easily and appropriately secure required thermal conductivity. Therefore, according to the example 2, it is possible to dissipate heat of the semiconductor device D more efficiently and appropriately than in the prior art.

The components of the above embodiment can be appropriately replaced with well-known components within the scope of the present invention, and the above embodiments, examples, and modifications may be appropriately combined together.

The invention claimed is:

1. A spring member for being provided between two pressed bodies facing each other in a first direction, the spring member comprising:
    a conductive plate and a support plate,
    wherein the conductive plate is formed of a material in which at least one of electrical conductivity and thermal conductivity thereof is higher than that of a material forming the support plate,
    the support plate is curved or bent such that an intermediate portion thereof in a second direction orthogonal to the first direction protrudes toward a second side of the spring member in the first direction,
    the conductive plate has a part positioned furthest toward a first side of the spring member in the first direction and a part positioned furthest toward the second side of the spring member in the first direction, and
    a surface of the conductive plate positioned furthest toward the first side is a first surface of the conductive plate, and a surface of the conductive plate positioned furthest toward the second side is a second surface of the conductive plate opposite to the first surface in the first direction, wherein
    the conductive plate extends along the support plate and crosses the support plate in the first direction, and
    an intermediate portion of the conductive plate in the second direction is positioned further toward the second side in the first direction than the support plate, and a portion of the conductive plate other than the intermediate portion of the conductive plate in the second direction is positioned further toward the first side in the first direction than the support plate.

2. The spring member according to claim 1, wherein the support plate is formed of the material having a higher Young's modulus than that of the material forming the conductive plate.

3. The spring member according to claim 1, wherein the two pressed bodies include a first pressed body and a second pressed body,
    two end portions of the conductive plate in the second direction contact the first pressed body, and an intermediate portion of the conductive plate in the second direction contacts the second pressed body, and
    two end portions of the support plate in the second direction press the first pressed body through the conductive plate, and the intermediate portion of the support plate in the second direction presses the second pressed body through the conductive plate.

4. The spring member according to claim 1, wherein different positions in the second direction of either one of the conductive plate and the support plate are provided with two through-holes, and two end portions in the second direction of the other of the conductive plate and the support plate are movably inserted through the through-holes.

5. The spring member according to claim 4, wherein sizes of the through-holes in a third direction orthogonal to the first direction and the second direction decrease toward an intermediate portion of the one of the conductive plate and the support plate in the second direction.

6. The spring member according to claim 1, wherein a plurality of the conductive plates are provided to be connected together in a third direction orthogonal to the first direction and the second direction, and the plurality of conductive plates are integrally formed.

7. A heat dissipation structure, comprising:
    the spring member according to claim 1; and
    two pressed bodies, the spring member being sandwiched therebetween, wherein either one of the two pressed bodies include a heat generator, the conductive plate contacts at least one portion of each of the two pressed bodies, and the spring member transfers heat from one to the other of the two pressed bodies through the conductive plate.

8. The heat dissipation structure according to claim 7, wherein either one of the two pressed bodies is a semiconductor device including the heat generator, and the other of the two pressed bodies is a heat sink.

9. A connection terminal structure, comprising:
the spring member according to claim 1; and
a frame body including an inner space in which the spring member is disposed,
wherein the conductive plate is configured to contact at least one portion of each of the two pressed bodies, and
either one of the two pressed bodies is an inner surface of the frame body, and the other of the two pressed bodies is disposed in the inner space.

10. The connection terminal structure according to claim 9, wherein the spring member includes two spring members disposed in the inner space of the frame body,
the two spring members are disposed in the inner space of the frame body such that orientations thereof are opposite to each other in the first direction, intermediate portions of conductive plates of the two spring members in the second direction face each other, and two end portions of the conductive plates in the second direction contact inner surfaces facing each other in the first direction among inner surfaces forming the inner space of the frame body,
at least one of two end portions of the inner space in the second direction is open, and the frame body is configured to insert a terminal between the intermediate portions of the conductive plates of the two spring members in the second direction through an opening portion of the inner space, and
either one of the two pressed bodies is an inner surface of the frame body, and the other of the two pressed bodies is the terminal to be inserted.

11. The connection terminal structure according to claim 9, wherein the frame body includes two frame members each formed in a U-shape when viewed in the second direction, and
either one of the frame members is provided with a cooling structure.

12. A spring member for being provided between two pressed bodies facing each other in a first direction, the spring member comprising:
a first member and a second member,
wherein the first member is formed of a material in which at least one of electrical conductivity and thermal conductivity thereof is higher than that of a material forming the second member,
the second member is curved or bent such that an intermediate portion thereof in a second direction orthogonal to the first direction protrudes toward a second side of the spring member in the first direction,
the first member has a part positioned furthest toward a first side of the spring member in the first direction and a part positioned furthest toward the second side of the spring member in the first direction, and
a surface of the first member positioned furthest toward the first side is a first surface of the first member, and a surface of the first member positioned furthest toward the second side is a second surface of the first member opposite to the first surface in the first direction, wherein
the first member extends along the second member and crosses the second member in the first direction, and
an intermediate portion of the first member in the second direction is positioned further toward the second side in the first direction than the second member, and a portion of the first member other than the intermediate portion of the first member in the second direction is positioned further toward the first side in the first direction than the second member.

* * * * *